United States Patent [19]

Machado

[11] Patent Number: 4,850,785

[45] Date of Patent: Jul. 25, 1989

[54] EPROM FEED APPARATUS

[75] Inventor: Joseph F. Machado, Santa Ana, Calif.

[73] Assignee: Quality Automation, Inc., Anaheim, Calif.

[21] Appl. No.: 25,515

[22] Filed: Mar. 13, 1987

[51] Int. Cl.$^4$ .............................................. B65G 65/00
[52] U.S. Cl. ....................................... 414/403; 29/741; 29/759
[58] Field of Search ............... 414/403, 411, 413, 414, 414/222, 224, 748, 910; 221/11, 197, 17, 106; 29/741, 809, 740, 759; 211/59.2; 312/35, 45, 72

[56] References Cited

U.S. PATENT DOCUMENTS

| | | | |
|---|---|---|---|
| 4,116,348 | 9/1978 | Atchley et al. | 29/740 X |
| 4,401,234 | 8/1983 | Droira et al. | 29/741 X |
| 4,599,026 | 7/1986 | Feiber et al. | 221/11 X |
| 4,618,305 | 10/1986 | Cedrone et al. | 198/465.1 X |
| 4,629,387 | 12/1986 | Stillman et al. | 198/465.3 X |
| 4,637,134 | 1/1987 | Tomita et al. | 29/741 |
| 4,647,269 | 3/1987 | Wedel et al. | 221/11 X |
| 4,690,302 | 9/1987 | Zebley et al. | 221/11 |
| 4,730,749 | 3/1988 | Buesing et al. | 221/123 |

FOREIGN PATENT DOCUMENTS

| | | | |
|---|---|---|---|
| 197518 | 10/1985 | Japan | 414/413 |
| 8204374 | 12/1982 | PCT Int'l Appl. | 29/741 |

*Primary Examiner*—David A. Bucci
*Attorney, Agent, or Firm*—Lawrence M. Nawrocki

[57] ABSTRACT

A machine for feeding a plurality of tubes (18) to a station at which articles in the tube, such as DIPs (10), are released into a discharge chute (46). The device includes a platen (56) which is inclined with respect to each of the two mutually-perpendicular horizontal axes. The tubes (18) are placed on the platen (56) The platen (56) has a wall (50) which occludes lower open ends of the tubes (18) when they are placed on the platen (56). The tubes (18) pass downwardly on the platen (56) along this wall (50). A second lower edge with respect to the other of the mutually-perpendicular horizontal axes, defines a releasing station, and when a tube (18) is in that station, its lower end is not occluded by the wall (50). Devices within the tube (18) are, thereby, permitted to pass outwardly into the discharge chute (46). Stops (80) are disposed proximate this lower edge of the platen (56) in order to arrest downward movement of the tubes (18) beyond the releasing station.

9 Claims, 3 Drawing Sheets

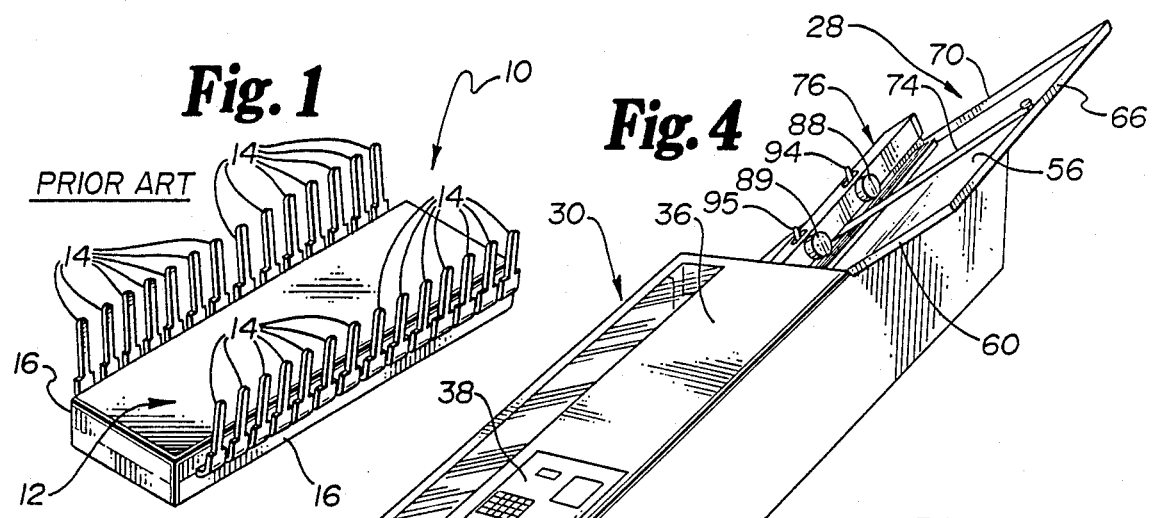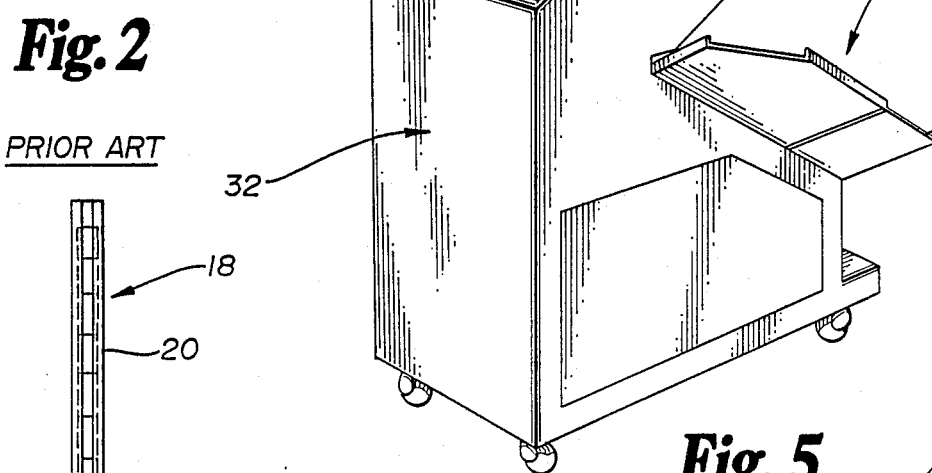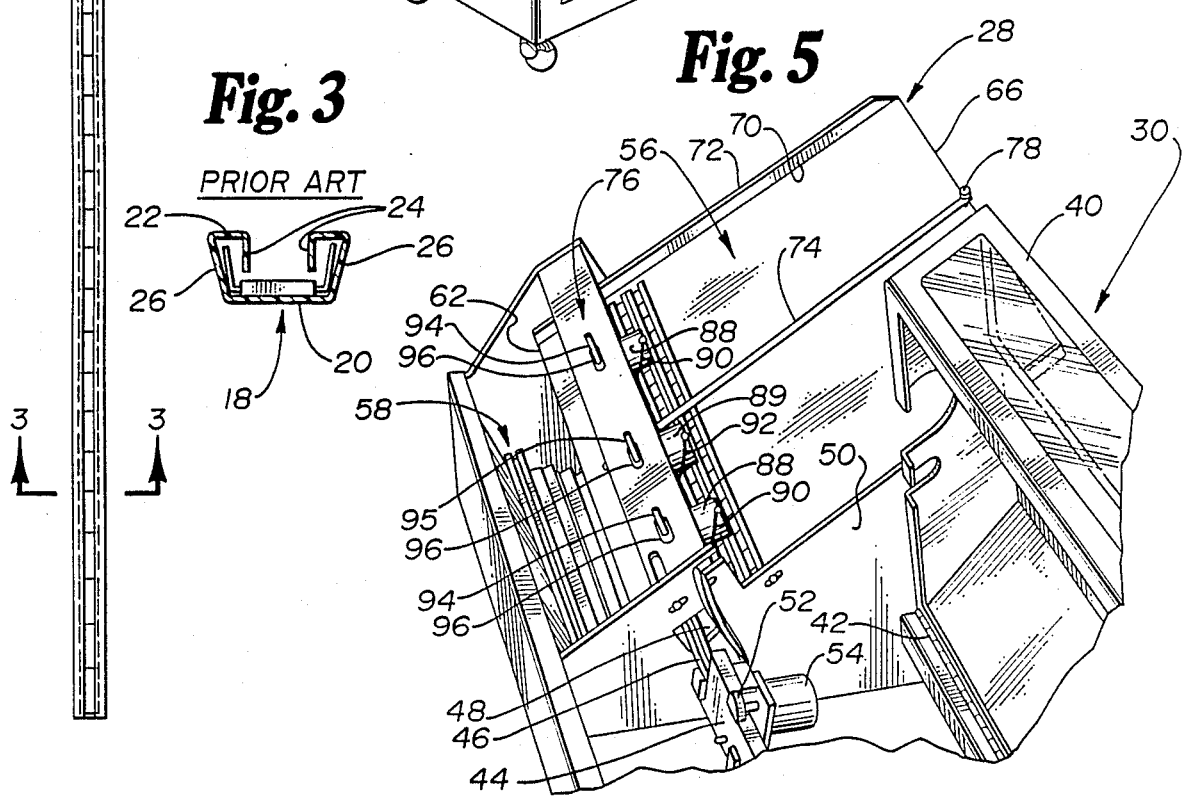

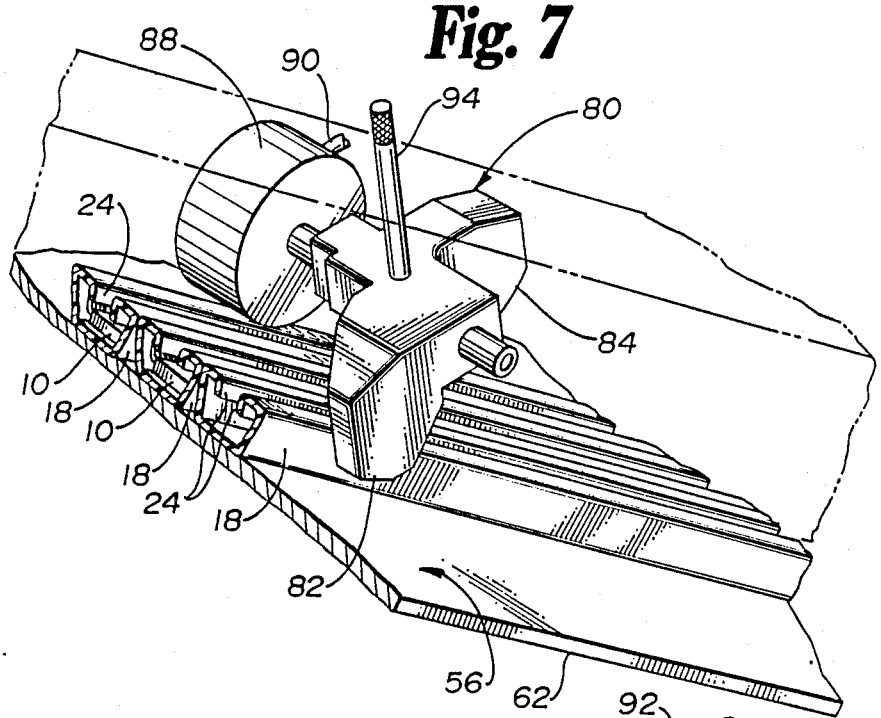
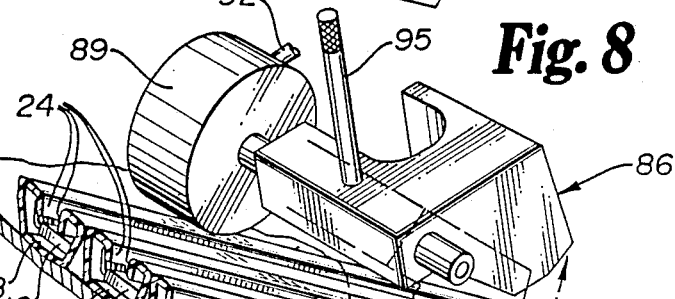
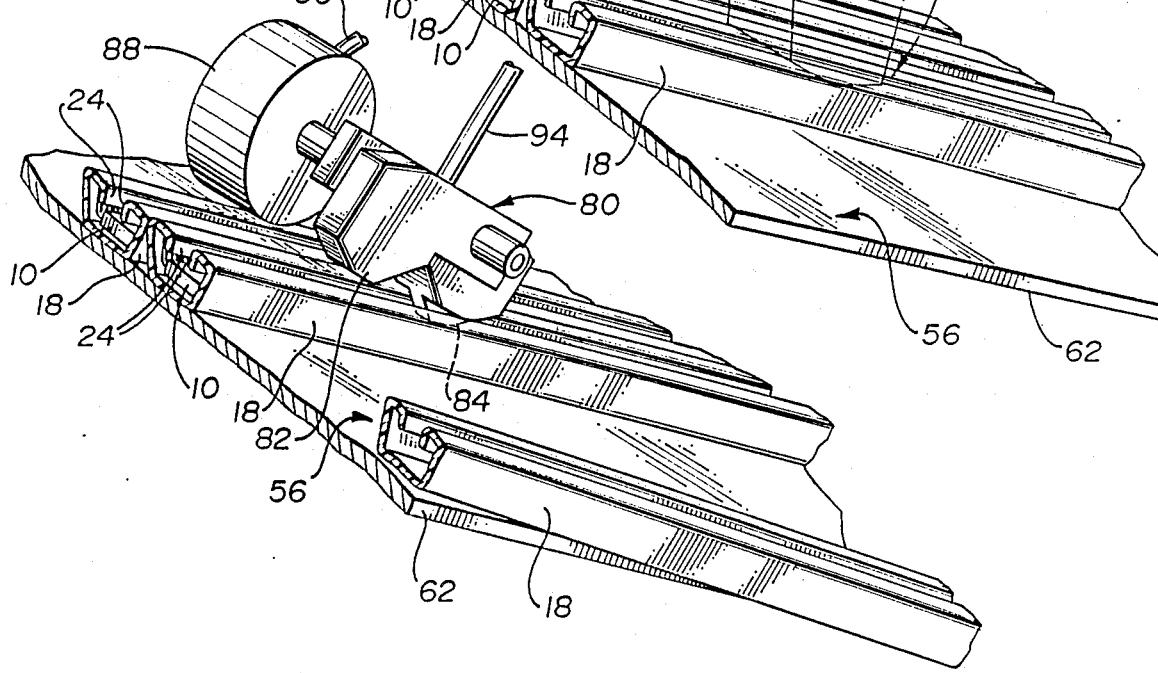

EPROM FEED APPARATUS

TECHNICAL FIELD

The present invention deals broadly with the field of integrated circuits. More narrowly, however, the invention is related to the field of mechanisms for feeding IC Devices such as EPROMs, in a variety of configuration packages such as DIPs (dual in line packages), from positions they occupy in stacked storage tubes, into a chute which channels them to a location at which they are programmed, tested, or have some other function performed upon them. Specifically, the present invention deals with mechanisms for feeding tubes containing such devices to a discharge station, facilitating emptying of the tubes, and releasing the tubes into a bin for subsequent use in receiving devices at, for example, the output end of the equipment with which the present invention is used.

BACKGROUND OF THE INVENTION

The relatively recent development of the semi-conductor has fairly revolutionized the electronics industry. The development of transistors and integrated circuits has induced the rethinking of manufacturing philosophies and has been responsible, in significant part, for the availability of many new products not previously commercially feasible because of size and expense constraints.

The revolution has greatly affected the consumer-oriented market. While only a few decades ago products such as pocket calculators were virtually unimaginable, the new semi-conductor technologies have made them a reality.

This electronics revolution has not, however, been restricted to the consumer market. Rather, its effects have impacted even more significantly upon the industrial, governmental, and defense markets.

One of such devices is known as an EPROM. This acronym stands for "erasable programmable read-only memory". While EPROMs can take one of various forms, a typical, and frequently employed, configuration is that known as a DIP. A more recently developed package form is known as an LCC or leadless chip carrier. DIPs are microcircuit packages with two rows of leads, each row extending from one of opposite edges of a main body of the device and generally perpendicular to the main body. Each row can vary in the number of leads it includes, but the number is typically between seven and twenty. The spider-like structure formed by the leads and the main body of the device renders the device capable of being easily inserted into an etched circuit board. LCCs are microcircuit packages with the contacts (leads) not extending beyond the edges of the device, and such devices are surface mounted on etched circuit boards.

Because of the unique construction of DIPs and LCCS, storing them in such a way so as to avoid damage during transportation is important. Storage tubes for DIPs having a generally trapezoidal outer-perimeter cross-section have been developed for this purpose and are employed to hold pluralities of DIPs and protect their leads while they are maintained within the tubes. The non-parallel sides of the tubes accommodate flaring of the leads of the devices, and distal edges of the tube defining wall are angled down between the positions of the leads of the devices when they are stored in the tube.

A plurality of DIPs are receivable in such a tube. The specific number will vary depending upon the length to which the tube is manufactured, the length of main body portions of the devices stored therein, and other factors. A pin can be inserted through an aperture at each end of the tube to secure devices received therein from inadvertently escaping.

Various high speed apparatus have been developed for programming and testing such devices. Because of the high degree of efficiency with which such apparatus operate, it is important that commensurately efficient fed systems be utilized so that the speed at which devices are fed to a programmer or tester is not an unduly limiting factor.

A number of machines are commercially available wherein devices in a tube are manually emptied into a chute which transmits them to a station at which they are programmed or tested. As would be apparent, machines wherein such feed systems are employed are restricted and limited in the speed at which they can operate. Frequently, programming or testing operations "mark time" while the apparatus is waiting for additional DIP parts to be inserted.

Improvements have been devised wherein tubes can be inserted into a hopper for subsequent automatic emptying. Devices of this type of which applicant is aware, however, involve a significant number of moving parts. For example, such automatic feed systems can employ elevators, tilting mechanisms, etc. By employing such relatively complicated mechanisms, the risk of jamming or other malfunctions increases and the devices will have a higher cost.

It is to these problems of the prior art and the desirable features dictated by these problems that the present invention is directed. It is an improved structure for feeding DIP storage tubes to a station at which they are emptied, for facilitating emptying of the tubes while they are at the station, and for disposing of the tubes into a bin after they have been emptied. These functions are performed automatically, in volume, and without unnecessary and operationally hindering moving parts.

SUMMARY OF THE INVENTION

The present invention is a mechanism which is employed for feeding a plurality of tubes to a station at which articles, such as DIPs, carried therein are released into a chute for conveying those articles to another location. The mechanism includes a platen for supporting the plurality of tubes in an inclined fashion. The platen is inclined with respect to each of two mutually-perpendicular, generally horizontal axes (that is, it is inclined obliquely with respect to two perpendicular horizontal directions). The platen has a first lower edge along which a wall extends. The tubes are placed on the platen with open lower ends thereof engaging this wall. The wall extends substantially along the length of the first lower edge, but terminates just prior to the location of the open lower end of the lowermost tube on the platen. A second lower edge defines a releasing station which the lowermost tube on the platen occupies when it is disposed to release the articles therein into the chute. The tubes on the platen, therefore, pass, by gravity down the platen in a direction toward the second lower edge with the open lower ends engaging the wall demarcating the first lower edge. The wall, thereby, occludes the open ends of the tubes until a tube is in the releasing station. Once in that station, articles in the tube are free to pass into the chute. Further, the mechanism includes means for holding a tube at the releasing station until articles contained therein have passed completely into the mouth of the chute. After the tube is emptied, it can be released to pass into, for example, a discharge bin.

In the preferred embodiment, a pair of stops, engageable with the lowermost tube, are employed to hold that tube at the releasing station until articles carried therein have been discharged. The stops employed, it is envisioned, would maintain the lowermost tube at the releasing station with its axis of elongation substantially aligned with an axis of the discharge chute.

It is contemplated that the stops would be mounted for pivoting about an axis which extends generally parallel to a direction in which the tubes move down the platen to the releasing station. The preferred embodiment employs a configuration wherein a first tab of each stop extends from the axis about which the stop pivots. Similarly, a second tab, spaced axially and angularly from the first tab, is also included. As the stop is pivoted about its axis, therefore, the tabs will more angularly.

The first tab moves between a first position wherein it obstructs passage of a tube beyond the releasing station, and a second position wherein passage is permitted. The second tab moves between a first position, pivoted away from a second lowermost tube, when the first tab is in its first position, and a second position, bearing down on the second lowermost tube to hold that tube against the platen, when the first tab is in its second position. As will be seen then, in view of this disclosure, tee axial distance between the tabs is such that, as the first tab obstructs movement of a tube out of the releasing station, the second tab will be able to engage the second lowermost tube in the stack.

Another desirable characteristic that the present invention incorporates is the provision of means to effect vibration of the lowermost tube when it is in the releasing station to facilitate complete emptying of that tube. Such means can take the form of a pivotally reciprocable tapper structure which, when rotated in one direction, strikes the lowermost tube while it is at the releasing station. Because of the reciprocation of the tapper structure, repeated striking creates the vibration necessary to empty the tube.

It is envisioned that this tapper structure would be mounted for pivoting about an axis generally parallel to those about which the stops pivot. It will be understood, however, that such a configuration is not exclusive.

The tapper, in addition to vibrating the lowermost tube at the releasing station, can function to ascertain when all tubes have passed down the platen and been released to a disposal bin. When this condition has been achieved, the tapper will not engage anything as it pivotally reciprocates. This failure to engage can, in turn, be converted to a determination that all tubes on the platen have been passed through the releasing station and have been allowed to pass into the disposal bin.

A rotary solenoid can be employed for pivoting each of the stops and the tapper. It will be understood, however, that other means for effective pivoting can also be used.

The present invention is, therefore, an improved feed apparatus for transmitting a plurality of tubes to a releasing station at which articles carried therein are discharged. The apparatus is simple in construction yet effective in accomplishing its functions. More specific features and advantages obtained in view of those features will become apparent with reference to the DETAILED DESCRIPTION OF THE INVENTION, appended claims, and accompanying drawing figures.

BRIEF DESCRIPTION OF THE DRAWINGS

FIG. 1 is a perspective view of a DIP as known in the prior art;

FIG. 2 is top plan view of a DIP transport tube as known in the prior art;

FIG. 3 is a sectional view taken generally along the line 3—3 of FIG. 2;

FIG. 4 is a perspective view of a programing machine which might employ the feed apparatus of the present invention;

FIG. 5 is perspective view from above illustrating a feed apparatus in accordance with the present invention;

FIG. 7 is fragmentary perspective view of a stop, in accordance with the present invention, obstructing movement of tubes down the platen;

FIG. 8 is view similar to that of FIG. 7 illustrating the tapper structure; and

FIG. 9 is view similar to FIGS. 7 and 8 illustrating a stop with its tabs in their second positions.

DETAILED DESCRIPTION OF INVENTION

Figure 6:
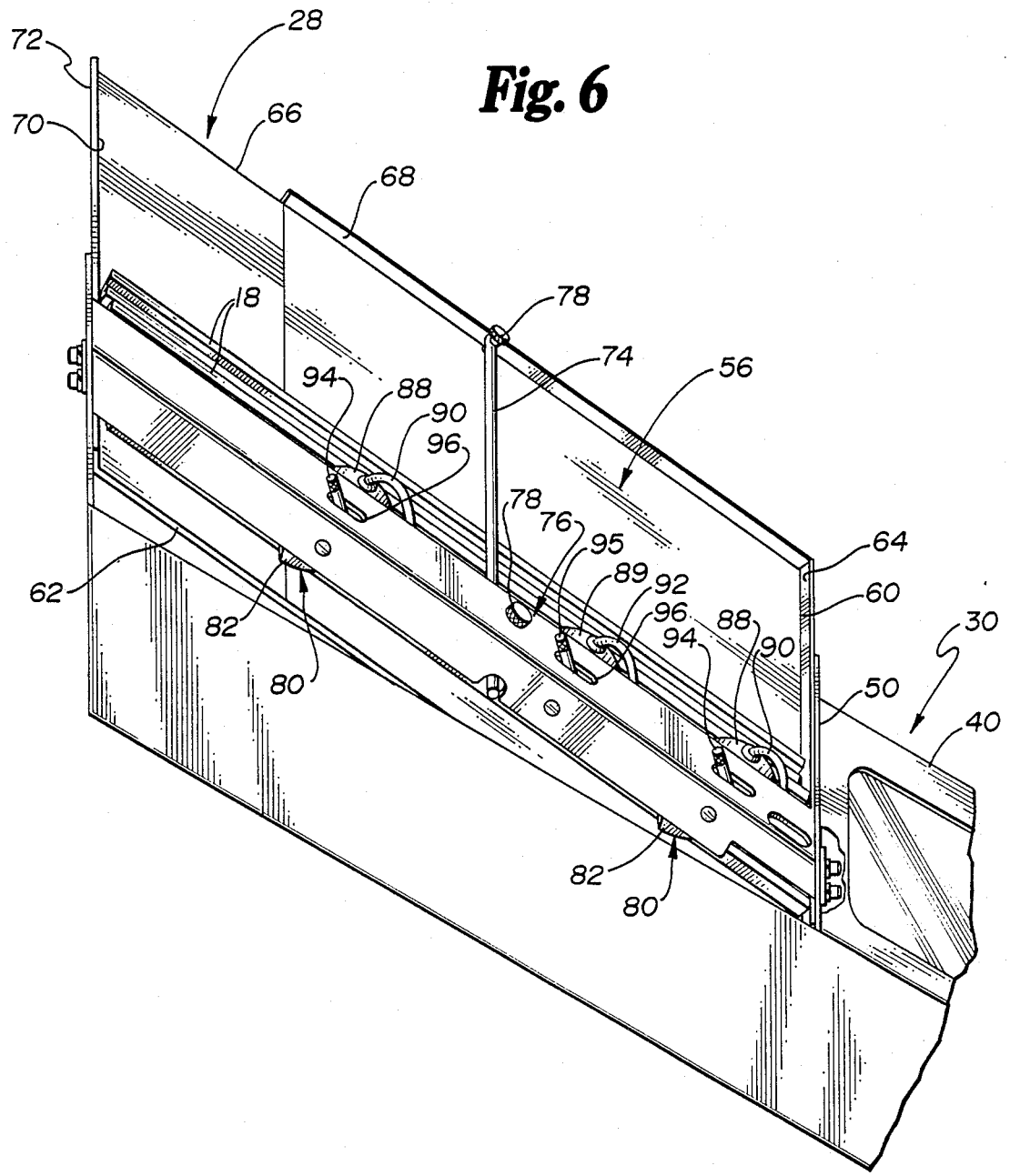
FIG. 6 is side elevational view of the apparatus of FIG. 5.

Referring now to the drawings, wherein like reference numerals denote like elements throughout the several views, FIGS. 1–3 illustrate various structures known in the prior art. FIG. 1 illustrates a DIP 10 having a main body portion 12 which is substantially rectangular in shape. A plurality of leads 14 extend from each of the longer sides 16 of the main body portion 12. Each row is illustrated as having fourteen discrete leads 14, but the prior art dictates that this number can vary from one DIP to another.

Although FIG. 1 illustrates the leads 14 as, initially, projecting from the main body portion 12 generally parallel to planes defined by the main body portion 12, shortly after emerging from the main body portion 12, the leads are angled at almost 90 degrees to the orientation at which they initially emerge. In fact, however, this angle is at something less than 90 degrees, and, as best seen in FIG. 3, the leads 14 are somewhat flared outwardly.

FIGS. 2 and 3 illustrate a storage and transportation tube 18 for devices 10 such as those illustrated in FIG. 1. FIG. 2 illustrates such a tube 18 in top plan. As can be seen in that figure, DIPs 10 are received longitudinally in the tube 18 and abut end-to-end. Closure pins (not shown) can be employed to preclude unintended exiting of the DIPs 10 in a tube 18. One of such pins can be inserted through a pair of corresponding, registered holes (not shown) which are, typically, provided at either end of the tube 18. When it is desired to have the devices 10 stored in a tube 18 removed therefrom, one of the pins can be withdrawn to leave the end from which the pin is withdrawn unobstructed.

FIG. 3 illustrates the tube 18 of FIG. 2 in cross-section. As seen in that figure, the outer perimeter of that cross-section is generally trapezoidal in shape. By so configuring the tube 18, the flare of the leads 14 of DIPs 10 stored in the tube 18 can be accommodated.

As further seen in FIG. 3, the bottom wall 20 of the tube 18 is generally planar and substantially parallel to the top wall 22. While not essential to tube construction, the upper wall 22 can be discontinuous, having inwardly extending portions 24 bent downwardly to capture leads 14 of DIPs 10 between a downwardly bent portion 24 and its corresponding, outwardly flared side wall 26. Such a construction is intended to provide greater protection to the integrated circuits 10 while they are stored and transported in the tube 18.

It will be understood that the tube 18 illustrated in FIGS. 2 and 3 is only illustrative of one of many types of tubes currently available and used in the industry. Lengths can vary as can cross-sectional dimensions and angling of side walls 26 relative to the bottom wall 20. Specific dimensions and angling is, of course, a function of the DIPs 10 intended to be stored and carried in a particular tube 18.

Referring now to FIG. 4, the present invention can be employed in, for example, equipment for programming EPROMs. Such equipment includes an input tray 28, a programming section 30, a labeling section 32, and an output tray 34. A panel 36 of the equipment housing can be provided with a control board 38 to regulate the operation of the equipment. Master devices (not shown) are provided to the programming section 30, and devices 10 to be programmed are dubbed with the appropriate characteristics as they pass through the programming section 30.

The present invention is applicable, primarily, to the input portion 28 of the equipment, although, in some respects, features of the invention are applicable to the output tray 34 also. FIG. 5 illustrates the input portion 28 of the programmer and a portion of the programming section 30. A cover 40 of the programming section 30 is pivoted back, along a hinge 42, to expose a core 44. EPROMs to be programmed are fed along the core 44 to desired locations at which programming occurs. A chute 46 is illustrated as passing from the input tray 28 to the programming section 30 through an aperture 48 in a wall 50 separating the two sections 28,30. EPROMs are allowed to pass down this chute 46 to the desired locations along the core 44 for programming. Speed of feed can be controlled by an appropriate singulation device. FIG. 5 illustrates a wheel singulator 52 which is rotated in angular segments by a stepper motor 54.

FIG. 5 illustrates the input section as including a platen 56 on which EPROM device storage and transportation tubes 18 can be placed. The platen 56 is inclined upwardly from both the wall 50 separating the programming section 30 and the input tray 28, and from a bin 58 in which emptied tubes 18 are discarded. As will be able to seen then, individual tubes 18 stacked on the platen will be angled downwardly with axes of elongation thereof aligned in a first direction, and the plurality of tubes 18 will slide downwardly in a direction generally perpendicular to that along which the tubes 18 are aligned. As will be discussed hereinafter, a plurality of tubes 18 will be placed on the platen 56 and will, sequentially, pass down the platen 56, through a releasing station at which EPROMs therein are discharged into the chute 46, and, thereafter, be discarded into the recovery bin 58.

Referring now to FIGS. 6–9, a device in accordance with the present invention includes the feed tray platen 56. The platen 56 has a first lower edge 60 (that is, one which is lower with respect to as axis along which individual tubes 18 are aligned) and a second lower edge 62 (that is, one which is lower with respect to an axis extending generally parallel to a direction in which 18 tubes pass down the platen 56). The first lower edge 60 is demarcated by a wall 64 against which open lower ends of storage and transport tubes 18 abrade as the tubes pass down the platen 56 to the releasing station. The wall 64 functions to maintain EPROMs 10 within the various tubes 18 from escaping from the tubes 18 prior to when one of the tubes 18 is in the releasing station and in registration with the mouth to the chute 46 going to the programming section 30.

An upper edge 66 of the platen 56 intersecting the first lower edge 60 is also shown as having a wall 68, at least along a portion of the edge 66. While this wall 68 can perform a containing function for the DIP tubes 18, it will be understood that it is not essential to the invention and might, in certain embodiments, be omitted. Similarly, the other upper edge 70 (that is, the one intersecting the second lower edge 62 of the platen 56), could also be provided with a lip or wall 72 to help contain the tubes 18 on the platen 56. As in the case of the other upper edge 66, however, such a lip or wall 72 could also be omitted.

FIGS. 4–6 illustrate a rod 74 which extends from a singulator assembly 76 to the upper edge 66 of the platen 56 intersecting the first lower edge 60. This rod 74 functions as a top constraint and is supported in position by threaded members 78 at either end, the lower member extending through the singulator assembly 76. This rod 76 is employed to preclude movement of the tubes 18 away from the platen 56 and potentially consequent overrunning of the tubes 18. Its distance from the platen 56 can, it is envisioned, be adjusted relative to the platen 56 depending upon the vertical dimension of the tubes 18 being fed.

The singulator assembly 76 overlies a portion of the platen 56 proximate the second lower edge 62, the portion of the platen 56 defining the releasing station. The singulator assembly 76, in accordance with the preferred embodiment of the present invention, carries a pair of pivotally mounted stops 80. These stops 80 are particularly illustrated in FIGS. 7 and 9.

Each stop 80 is disposed for pivoting between first and second positions. In the preferred embodiment illustrated in the figures, this pivoting is with respect to respective axes extending generally parallel to an axis along which the tubes 18 pass down the platen 56.

FIG. 7 illustrates a stop 80 in its first position. A first tab 82 is rotated downwardly to preclude passage of the lowermost tube 18 in the stack along the platen 56 beyond the releasing station. Typically, both stops 80 would be positioned and their actuation coordinated such that an axis of elongation of a tube 80 at the station would be aligned with an axis of elongation of the chute 46 to the programming section 30.

As will be understood, the wall 64 demarcated by the first lower edge 60 of the platen 56 would not extend sufficiently far to occlude movement of EPROMs in the lowermost tube 18 outwardly therefrom and into the chute 46. Rather, it would specifically afford egress from a tube 18 at the releasing station to the EPROMs therein. The wall 64 would, however, preclude egress of all EPROMs in tubes 18 above the releasing station.

Each stop 80 further includes a second tab 84 which is spaced both angularly and axially, with respect to the axis about which the stop 80 pivots, from its respective first tab 82. The axial spacing is such that, when the first tab 82 is occluding passage of tubes 18 down the platen 56, the second tab 84 will be at an axial location above the second lowermost tube. The angular spacing is such that, when the first tab 82 is occluding passage of tubes 18 down the platen 56, the second tab 84 will be in a first position retracted upwardly and away from the second lowermost tube.

As the stops 80 are rotated, each first tab 82 will move toward its second position (that seen in FIG. 9). As this pivoting occurs, however, the second tab 84, because of its spacial relationship to the first tab 82, will engage the second lowermost tube in the stack to preclude its movement along the platen 56.

It will be understood that this preclusion of movement can be effected in a number of ways. FIG. 9 illustrates the tab 84 as actually entering between downwardly bent portions 24 of the tube defining wall. Holding of the second lowermost tube could, however, be accomplished by the second tab 84 impinging downwardly upon the second lowermost tube to hold it against the platen 56.

With the stops 80 in their second positions, the lowermost tube in the stack is released to pass downwardly into the recovery bin 58. Pivoting of the stops 80 to release the lowermost tube 18 will, of course, only be after it has been ascertained that the lowermost tube 18 in the releasing station is empty. This determination can be made in various ways such as optics, etc.

Once an empty tube at the releasing station has been released, the stops 80 can be actuated to pivot in a reverse direction back to their first positions wherein the first tabs 82 thereof will hold the lowermost tube in the stack to the releasing station. In effect what transpires is a sliding of all of the tubes 18 on the platen 56 down to where the formerly second lowermost tube becomes the lowermost tube and is engaged by the first tabs 82 of the stops 80. As the formerly second lowermost tube achieves this position, it will be in registration with the chute 46 to the programming section 30, and the EPROMs therein will be free to pass outwardly from the tube 18.

Because there is, typically, some play between EPROMs in a tube 18 and the tube wall, there is a possibility that a hang-up can occur. In order to minimize the likelihood of this happening, means can be provided to vibrate the tube at the releasing station to facilitate complete passage of all EPROMs out of the tube 18.

FIG. 8 illustrates a tapper mechanism 86 which functions to effect this vibration. The tapper 86 can be disposed for pivoting repetitively against a tube 18 in the releasing station. Such cyclical engagement, it has been found, virtually eliminates hang-ups of devices within the tube.

As in the case of the stops 80, the tapper 86 can be disposed for pivoting about an axis extending generally parallel to an axis along which the tubes 18 pass down the platen 56. Pivoting of the tapper 86 and the stops 80 can be effected by employment of a rotary solenoid 88, 89. Concurrent signals can be sent to solenoids 88 actuating the stops 80 through appropriate cabling 90, the stops 80 being actuated concurrently. Similarly, the solenoid 89 for the tapper mechanism can be initiated by signals sent to the solenoid 89 by appropriate cabling 92 to initiate the repetitive reciprocal pivoting of the tapper 86.

The tapper mechanism 86 can function as a sensor for ascertaining when all tubes 18 stacked on the platen 56 have passed the releasing station and been deposited in the recovery bin 58. As will be able to be seen in view of this disclosure, as the tapper 86 is pivoted, rotation beyond a certain point will be precluded by a tube 18 at the releasing station, as long as a tube 18 is present. If a tube 18 is not present, the tapper 86 will be permitted to pivot to a position beyond that at which it is normally stopped. If such pivoting occurs, movement of the tapper 86 beyond its normally terminal position can be converted to a signal representative of a situation wherein no further tubes remain on the platen 56, all having been released for passage to the recovery bin 58.

Extensions 94, 95 can be provided for manual actuation of the stops 90 and tapper 86 under circumstances that would require such operation. FIGS. 7 and 8 illustrate the optimal positioning of such extensions 94, 95. As seen in those figures, it would be desirable to have the extensions 94, 95 emanating directly radially from the axis with respect to which the stop 80 or tapper 86 pivots. By being so constructed, the extension 94, 95 can impart maximum torque to its respective stop 80 or tapper 86.

FIG. 6 illustrates the manual extensions 94, 95 as protruding from slots 96 in the singulator assembly 76. The extensions 94, 95, in their normal, non-implemented positions, would be at corresponding ends of their slots 96. In order to effect manual actuation of one or both of the stops 80 and/or the tapper 86, appropriate extension or extensions could be toggled to the other end of their respective slots 96. Manual actuation might be necessary during testing or demonstration of the equipment.

Numerous characteristics and advantages of the invention have been set forth in the foregoing description. It will be understood, of course, that this disclosure is, in many respects, only illustrative. Changes can be made in details, particularly in matters of shape, size, and arrangement of parts without exceeding the scope of the invention. The invention's scope is defined in the language in which the appended claims are expressed.

What is claimed is:

1. Apparatus for successively feeding a plurality of tubes, having open lower ends, to a station at which articles therein are released into a mouth of a discharge chute, and for releasing emptied tubes into a receptacle as another filled tube is fed to the releasing station, comprising:
   (a) a platen, for supporting the plurality of tubes, inclined with respect to each of two mutually-perpendicular horizontal axes, said platen having a first lower edge, demarcated by a wall, substantially along the length thereof, and a second lower edge, defining the releasing station, toward which the tubes are successively fed, said first lower edge wall occluding open lower ends of all tubes supported by said platen above a lowermost of the tubes, and leaving the open lower end of the lowermost tube unobstructed so articles therein can enter into the mouth of the discharge chute; and
   (b) means for holding a tube at the releasing station until articles contained therein have passed into the mouth of the discharge chute, said holding means comprising:
   (i) a first stop mounted for pivoting about an axis extending generally parallel to a direction in which the tubes move down said platen to the releasing station, and including a first tab extending from said axis and being disposed for angular movement between a first position obstructing passage of a tube beyond the releasing station, and a second position wherein passage is permitted; a second tab, extending from said axis, spaced axially and angularly from said first tab, and being disposed for angular movement between a first position pivoted away from a second lowermost tube when said first tab is in its first position, and a second position bearing down on the second lowermost tube to hold the second lowermost tube against said platen when said first tab is in its second position; and means for pivoting said stop wherein said tabs are angularly moved between respective first and second positions;

(ii) a second stop mounted for pivoting about an axis extending generally parallel to a direction in which the tubes move down said platen to the releasing station, and including a first tab extending from said axis and being disposed for angular movement between a first position obstructing passage of a tube beyond the releasing station, and a second position wherein passage is permitted; a second tab, extending from said axis, spaced axially and angularly from said first tab, and being disposed for angular movement between a first position pivoted away from a second lowermost tube when said first tab is in its first position, and a second position bearing down on the second lowermost tube to hold the second lowermost tube against said platen when said first tab is in its second position; and means for pivoting said stop wherein said tabs thereof are angularly moved between respective first and second positions in coordination with said tabs of said first stop;

(c) wherein, when said first tabs of said first and second stops obstruct passage of a tube beyond the releasing station, an axis of elongation of said tube is aligned with an axis of the discharge chute.

2. Apparatus in accordance with claim 1 wherein said pivoting means comprises a rotary solenoid.

3. Apparatus for successively feeding a plurality of tubes, having open lower ends, to a station at which articles therein are released into a mouth of a discharge chute, and for releasing emptied tubes into a receptacle as another filled tube is fed to the releasing station, comprising:

(a) a platen, for supporting the plurality of tubes, inclined with respect to each of two mutually-perpendicular horizontal axes, said platen having a first lower edge, demarcated by a wall, substantially along the length thereof, and a second lower edge, defining the releasing station, toward which the tubes are successively fed, said first lower edge wall occluding open lower ends of all tubes supported by said platen above a lowermost of the tubes, and leaving the open lower end of the lowermost tube unobstructed so articles therein can enter into the mouth of the discharge chute;

(b) means for holding a tube at the releasing station until articles contained therein have passed into the mouth of the discharge chute; and (c) a tapper, for vibrating the lowermost tube to facilitate release of articles therein, disposed to pivot to reciprocably engage the lowermost tube while it is at the releasing station.

4. Apparatus in accordance with claim 3 wherein said tapper is disposed for pivoting about an axis extending generally parallel to a direction in which the tubes move down said platen.

5. Apparatus in accordance with claim 3 further comprising means for sensing when the last tube supported on said platen has been released into the receptacle.

6. Apparatus in accordance with claim 5 wherein said sensing means comprises said tapper, wherein, when a tube is not present in the releasing station, said tapper will pivot unobstructed.

7. Apparatus for effecting gravity feed both of a plurality of tubes, containing articles therein, to a releasing station and, after the articles are released, into a receptacle, and of the articles in the tubes, while a tube is at the releasing station, into a mouth of a discharge chute, comprising a platen, inclined with respect to both of two mutually-perpendicular horizontal axes, having first and second lower edges, said first lower edge being demarcated by a wall, substantially along the length thereof, and said second lower edge defining the releasing station; wherein tubes are successively gravity fed toward, and beyond, the releasing station with open lower ends of the tubes being occluded by said wall as the tubes pass along said platen to the releasing station; and wherein the open lower end of the lowermost tube on the platen and at the releasing station is unobstructed so articles therein can enter into the mouth of the discharge chute.

8. Apparatus in accordance with claim 7 further comprising means for holding a tube at the releasing station until articles contained therein have passed into the mouth of the discharge chute.

9. Apparatus in accordance with claim 8 wherein said holding means comprises a pair of stop engageable with the lowermost tube to hold the lowermost tube at the releasing station with an axis of elongation thereof aligned with an axis of the discharge chute.

* * * * *